United States Patent [19]

Lovinger et al.

[11] 4,356,505

[45] Oct. 26, 1982

[54] CONDUCTIVE ADHESIVE SYSTEM INCLUDING A CONDUCTIVITY ENHANCER

[75] Inventors: Andrew J. Lovinger, New York, N.Y.; Louis H. Sharpe, Morris Township, Morris County, N.J.

[73] Assignee: Bell Telephone Laboratories, Incorporated, Murray Hill, N.J.

[21] Appl. No.: 91,453

[22] Filed: Nov. 5, 1979

Related U.S. Application Data

[63] Continuation of Ser. No. 931,159, Aug. 4, 1978, abandoned.

[51] Int. Cl.³ .............................................. H01L 23/28
[52] U.S. Cl. ..................................... 357/72; 156/330; 252/511; 252/512; 252/514; 427/82; 427/96; 29/575; 29/590

[58] Field of Search ............ 252/514, 511, 512, 363.5; 427/96, 207 R, 82; 156/330; 260/33.2 EP, 31.4 EP, 37 EP; 357/72; 428/901; 29/575, 589, 590; 106/308 R, 308 Q, 309

[56] References Cited

U.S. PATENT DOCUMENTS

| | | | |
|---|---|---|---|
| 2,795,680 | 6/1957 | Peck | 252/511 |
| 2,868,767 | 11/1959 | Cyba et al. | 260/32.2 EP |
| 3,931,109 | 2/1976 | Martin | 260/31.4 EP |
| 4,012,832 | 3/1977 | Crane | 252/514 X |

*Primary Examiner*—J. L. Barr
*Attorney, Agent, or Firm*—Peter V. D. Wilde

[57] ABSTRACT

An electric conductive adhesive system includes a hydroxy terminated ether or ester thereof which serves as a conductivity enhancer. Conductivity levels attained exceed those of prior art systems.

4 Claims, No Drawings

CONDUCTIVE ADHESIVE SYSTEM INCLUDING A CONDUCTIVITY ENHANCER

This application is a continuation of application Ser. No. 931,159, filed Aug. 4, 1978, now abandoned.

This invention relates to electrically conductive epoxy adhesive systems and to electrical devices and methods including the system. More particularly, the present invention relates to an electrically conductive epoxy adhesive system including a conductivity enhancer.

In recent years, the use of metal filled thermoset polymers as electrically conductive adhesives has been extensive and has resulted in partial replacement of the traditional eutectic bonding and thermocompression techniques, particularly in the adhesion of miniature devices such as light emitting diodes and integrated circuits.

Typically, these thermoset polymers comprise a mixture of an epoxy resin and a conductive component such as silver flake, copper and the like in combination with suitable curing agents, diluents and the like. At an early stage in the development of these adhesive systems, workers in the art determined that in order to maximize conductivity within the system, it was necessary to promote dispersion of the conductive component within the epoxy matrix. This end was normally attained by coating the particles of the conductive component with a thin film of an organic material. Typical of materials used for this purpose are fatty acids and compounds thereof, and it is found that commercially available conductive fillers, such as silver flake, typically have such coatings. These films have been found to be highly effective in promoting dispersion of the conductive component in the liquid epoxy resin system and they often tend to render the dispersion insulating before it is subjected to elevated temperature cure. Accordingly, it is essential that in the subsequent processing sequence, these films be stripped in order to attain the desired conductivity. This is normally effected by the heat associated with an elevated temperature curing cycle. The specific temperature levels are dependent upon the formulation employed. Although these prior art conductive adhesive systems have proven satisfactory, investigatory efforts have continued with a view toward the development of systems evidencing enhanced conductivity and yielding conductivity levels comparable to those of prior art systems at lower curing temperatures.

In accordance with the present invention, these ends are attained by the use of a novel conductivity enhancer. Compounds found to be particularly suitable for the described purpose are the hydroxy-terminated ethers, especially polyethylene glycols, $HOCH_2(CH_2OCH_2)_nCH_2OH$, and the like, with n being within the range of 2-10. The upper limit on n is dictated by practical considerations relating to solubility.

Epoxy resins employed in the adhesive systems described may be selected from epoxy-novolac resins, bisphenol A-epichlorohydrin resins, cycloaliphatic epoxies and the like. The selection of a particular epoxy resin is not critical, the only requirement being that it be compatible with the ethers chosen.

When preparing the adhesive system, with a conductivity component having an organic coating of the type described above the epoxy resin is initially mixed with a reactive viscosity reducer and a curing agent, each of which is well known in the art. Then, the conductivity enhancer described herein is added to the resin system in an amount ranging from 0.1-10 percent, by weight, based upon the weight of the resin. These limits are dictated by practical considerations. Thus, the use of conductivity enhancer in excess of the maximum adversely affects the mechanical and thermal properties of the system whereas less than the noted minimum fails to yield the desired result. Then, the conductivity component, typically in the form of metal powder or flakes ranging in particle size from 0.5-50 microns, is added to the epoxy resin in an amount such that the conductivity component comprises from 25-85% by weight, based upon the total weight of the composition.

An example of the present invention is set forth below. This example is included merely for purposes of exposition and it will be appreciated by those skilled in the art that it is not restrictive in nature.

EXAMPLE

An epoxy resin adhesive system was prepared comprising the following components:

(a) 31%, by weight, of an epoxy novolac resin having an average of 3.6 epoxy groups per molecule, a viscosity ranging from 20,000 to 50,000 cps at 50° C. and an epoxy equivalent weight within the range of 176-181, (b) 44%, by weight, resorcinol diglycidyl ether, having a viscosity ranging from 300-500 cps at 25° C. and an epoxy equivalent weight of approximately 127, (c) 12.5%, by weight, tetraglycidyl ether of tetraphenyl ethane.

(d) 12.5%, by weight, butanediol diglycidyl ether, (e) 0.0275 moles per 100 grams of resin of 1-dimethylcarbamoyl-4-phenylimidazole, and (f) 1.4% by weight, of a hydroxy terminated ether, $HOCH_2(CH_2OCH_2)_{n=3}CH_2OH$ To this mixture, commercially obtained, dispersant-coated silver flake having a surface area ranging from 0.75 to 1.35 m$^2$/g containing a maximum of 0.02% chloride and a maximum particle dimension ranging from about 0.5 to about 5 μm was added. Electrical resistivity was then measured using a stripe specimen. This involved the use of a microscope slide to which two copper pads spaced 25 mm apart were bonded with an adhesive. Pressure sensitive tape was laid lengthwise over the pads from end to end of the slide. Two razor cuts, 2.5 mm apart, were then made lengthwise in the tape over the pads from end to end and the section of the tape so cut was peeled away. The conductive adhesive was forced into the opening using the edge of a microscope slide so that it was level with the top surface of the remaining tape which was then peeled away. There remained a stripe of adhesive bridging the copper pads which, after curing at 175° C. for 30 minutes, was 2.5 mm wide and approximately 0.038 mm thick. The resistance was computed from the voltage drop across the stripe at a current of 100 milliamperes using a Keithley 160B Digital Multimeter and a Keithley 227 constant current source. The resistivity was as follows:

| Resistivity, | $\rho$(ohm-cm) | (average of 2 specimens) |
|---|---|---|
| initial | $1.80 \times 10^{-4}$ | |

The foregoing procedure was repeated with the exception that 2.4%, by weight, and 6.2%, by weight, of hydroxy terminated ether were added. The resistivities were $1.43 \times 10^{-4}$ ohm-cm and $1.22 \times 10^{-4}$ ohm-cm, respectively. For comparative purposes, the foregoing procedure was repeated without the presence of the hydroxy terminated ether. The resistivity was $3.15 \times 10^{-4}$ ohm-cm.

It will also be understood by those skilled in the art that the described conductivity enhancers may be used as a conductivity rejuvenant for conductive adhesives, which, as known, by virtue of prolonged storage in the uncured state have lost some of their conductivity attributes.

In the claims, we mean by "epoxy resin" the epoxy without additives, and by "epoxy material" the epoxy resin plus additives such as conductivity components, diluents, curing agents, and the like.

We claim:

1. A method for bonding one electrical assembly or element to another or to a support member with an epoxy material, comprising the steps of applying an uncured epoxy material comprising a conductivity component consisting essentially of metal powder or flakes, of particle size typically between 0.5 μm and 50 μm, the weight of the conductivity component being between about 25% and about 85% by weight of the epoxy material, and a dispersing component, to at least one surface, applying the surfaces to be bonded together, and curing the epoxy material, the method characterized in that the epoxy material contains 0.1% to 10%, by weight, based on the weight of the epoxy resin, of a conductivity enhancer selected from the group consisting of

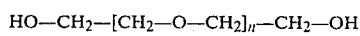

n being within the range of 2–10.

2. The method of claim 1 in which the epoxy material additionally contains a curing agent.

3. An electrical device, comprising at least two elements bonded together with an electrically conductive bonding material comprising an epoxy resin, a conductivity component consisting essentially of metal powder or flakes of particle size, typically between 0.5 μm and 50 μm, the weight of the conductivity component being between about 25% and about 85% by weight of the epoxy material, and a dispersing component, characterized in that the bonding material further comprises 0.1% to 10%, by weight, based on the weight of the epoxy resin, of a conductivity enhancer selected from the group consisting of

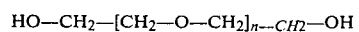

n being within the range of 2–10.

4. An integrated circuit, comprising a semiconductor chip bonded to a support substrate with an epoxy resin comprising a conductivity component consisting essentially of metal powder or flakes, of particle size typically between 0.5 μm and 50 μm, the weight of the conductivity component being between about 25% and about 85% by weight of the epoxy material, and a dispersing component, characterized in that the bonding material further comprises 0.1% to 10%, by weight, based on the weight of the epoxy resin, of a conductivity enhancer selected from the group consisting of

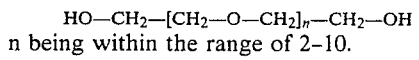

n being within the range of 2–10.

* * * * *

UNITED STATES PATENT AND TRADEMARK OFFICE
CERTIFICATE OF CORRECTION

PATENT NO. : 4,356,505

DATED : October 26, 1982

INVENTOR(S) : Andrew J. Lovinger and Louis H. Sharpe

It is certified that error appears in the above-identified patent and that said Letters Patent are hereby corrected as shown below:

Column 2, line 36, "n=3" should read --$\underset{\sim}{n}=3$--.
Column 4, line 18, "$HO-CH_2-[CH_2-O-CH_2]_n-CH2-OH$" should read --$HO-CH_2-[CH_2-O-CH_2]_n-CH_2-OH$--.

Signed and Sealed this

Fifth Day of April 1983

[SEAL]

Attest:

Attesting Officer

GERALD J. MOSSINGHOFF

Commissioner of Patents and Trademarks